United States Patent
Lee

[11] Patent Number: 5,861,069
[45] Date of Patent: Jan. 19, 1999

[54] METHOD FOR FORMING AN INDIUM ANTIMONIDE LAYER

[75] Inventor: Seung-Ho Lee, Seoul, Rep. of Korea

[73] Assignee: SKM Limited, Seoul, Rep. of Korea

[21] Appl. No.: 918,871

[22] Filed: Aug. 26, 1997

[30] Foreign Application Priority Data

Aug. 31, 1996 [KR] Rep. of Korea .................. 1996 37490
May 2, 1997 [KR] Rep. of Korea .................. 1997 17027
May 2, 1997 [KR] Rep. of Korea .................. 1997 17028

[51] Int. Cl.$^6$ .................................................. H01L 21/24
[52] U.S. Cl. .................. 148/512; 148/527; 148/537; 427/250; 427/255
[58] Field of Search ................................. 148/512, 527, 148/537; 427/250, 255

[56] References Cited

U.S. PATENT DOCUMENTS

| | | |
|---|---|---|
| 4,177,298 | 12/1979 | Shigeta et al. ..................... 427/250 |
| 4,833,103 | 5/1989 | Agostinelli et al. ................ 427/108 |
| 5,312,643 | 5/1994 | Yamamoto et al. ................. 427/108 |
| 5,346,842 | 9/1994 | Gedridge ............................ 427/255 |

*Primary Examiner*—George Wyszomierski
*Attorney, Agent, or Firm*—Anderson, Kill & Olick, P.C.

[57] ABSTRACT

A method forms an indium antimonide layer by a sequential evaporation for use as a magnetic sensing material having high electron mobility. The method includes the steps of: (a) preparing a substrate; (b) pre-heating the substrate (c) depositing an antimony layer on top of the substrate; (d) forming an indium layer on top of the antimony layer to thereby obtain a sequentially deposited layer, wherein the sequentially deposited layer includes the antimony and the indium layers; (e) providing a protection layer on top of the sequentially deposited layer; and (f) heat treating the sequentially deposited layer to force inter-diffusion of antimony and indium, thereby producing the indium antimonide layer.

17 Claims, 5 Drawing Sheets

METHOD FOR FORMING AN INDIUM ANTIMONIDE LAYER

FIELD OF THE INVENTION

The present invention relates to a method for forming an indium antimonide layer; and, more particularly, to a method for forming an indium antimonide layer by using a sequential evaporation.

DESCRIPTION OF THE PRIOR ART

As is well known, a magnetically sensitive indium antimonide(InSb) thin film has been widely used as a magnetic sensor material due to its high electron mobility. However, owing to a severe vapor pressure difference between indium(In) and antimony(Sb), the vaporization of InSb in the usual deposition method without InSb decomposing is not possible. And it is difficult to control the evaporation conditions of two materials independently in order to keep the deposition rate of In and Sb almost identical during the evaporization.

In order to solve the problem described, a number of methods for forming an InSb thin film 29, such as a recrystallization method, a three-temperature method, a flash evaporation method and a sequential evaporation method, have been introduced.

In FIGS. 1A to 1E, there are provided schematic cross sectional views illustrating one of the prior art methods, i.e., sequential evaporation method, for manufacturing the InSb thin film 29 for use in a hall device. The process for manufacturing the InSb thin film 29 may begin with the preparation of a substrate 20 preferably made of Si. The temperature of the substrate 20 is maintained at room temperature during the process. Thereafter, an adhesion layer 22 made of indium(In) and having a thickness of 100 Å is uniformly formed on top of the substrate 20 by using a evaporization method to enhance the adhesion of the substrate 20 and a layer to be deposited, as shown in FIG. 1A.

An Sb layer 24 and an In layer 26 are deposited sequentially at room temperature on top of the adhesion layer 22 to thereby obtain a sequentially deposited layer, wherein each of the layers 24, 26 in the sequentially deposited layer has a thickness of 5000 Å, as illustrated in FIGS. 1B and 1C.

In a subsequent step, a protection layer 28, usually made of $In_2O_3$ and having a thickness of 1 $\mu$m, is uniformly formed on top of the In layer 26 by using such a technique as thermal oxidation, as depicted in FIG. 1D.

In a following step, the sequentially deposited layer is annealed to form a compound phase through the inter-diffusion of the In layer 26 and the Sb layer 24 to thereby form the InSb thin film 29, as shown in FIG. 1E. The annealing process is performed in a vacuum chamber which is maintained below $5 \times 10^{-6}$ torr. A heating source is a halogen lamp and the temperature of the InSb thin film 29 is monitored by a thermocouple(not shown) attached to the substrate 20.

One of the major shortcomings of the above-described sequential evaporation method, as illustrated in FIGS. 1A to 1E, is that it requires the formation of adhesion layer incorporated to prevent the delamination of the substrate 20 and the Sb layer 24, unnecessarily complicating the formation of the InSb layer 24.

SUMMARY OF THE INVENTION

It is, therefore, a primary object of the present invention to provide a simpler method for forming an indium antimonide layer by using a sequential evaporation.

In accordance with the present invention, there is provided a method for forming an indium antimonide layer by a sequential evaporation for use as a magnetic sensing material having high electron mobility, the method comprising the steps of: (a) preparing a substrate; (b) pre-heating the substrate for improving the adhesion between the substrate and a layer to be deposited on top of the substrate; (c) depositing an antimony layer on top of the substrate; (d) forming an indium layer on top of the antimony layer to thereby obtain a sequentially deposited layer, wherein the sequentially deposited layer includes the antimony and the indium layers; (e) providing a protection layer on top of the sequentially deposited layer for suppressing a reevaporation of the antimony layer; and (f) heat treating the sequentially deposited layer to force inter-diffusion of antimony and indium, thereby producing the indium antimonide layer.

BRIEF DESCRIPTION OF THE DRAWINGS

The above and other objects and features of the present invention will become apparent from the following description of preferred embodiments read in conjunction with the accompanying drawings, wherein.

DETAILED DESCRIPTION OF THE PREFERRED EMBODIMENTS

Figure 1A:
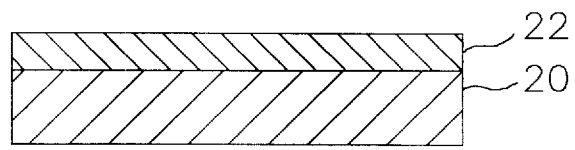
FIGS. 1A to 1E provide schematic cross sectional views of a prior art method for manufacturing an InSb thin film by using a sequential evaporation method.
Figure 1B:
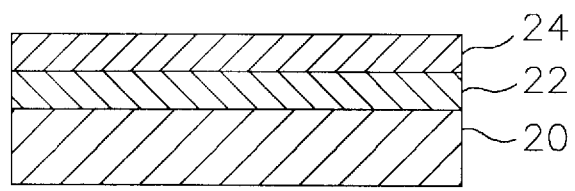
Figure 1C:
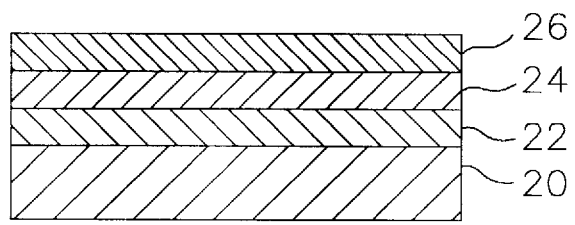
Figure 1D:
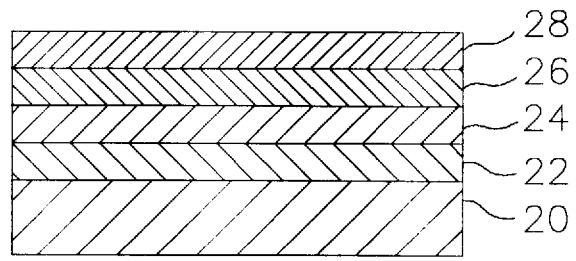
Figure 1E:
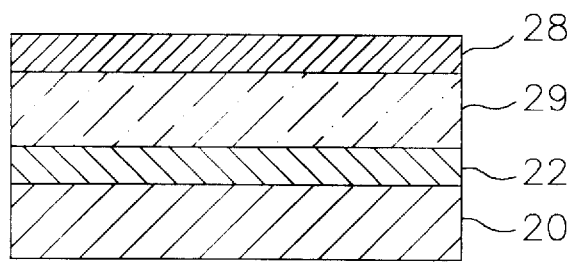
Figure 2A:
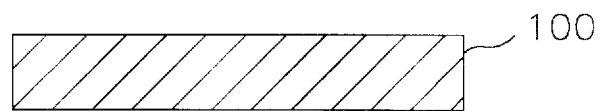
FIGS. 2A to 2F depict cross sectional views of the manufacturing steps of a sequential evaporation method for manufacturing an InSb thin film in accordance with the present invention.

Referring to FIGS. 2A to 2F, there are shown cross sectional views of the manufacturing steps of a preferred embodiment of a sequential evaporation method for forming an InSb thin film. The novel process for forming the InSb thin film layer begins with the preparation of a substrate 100, as shown in FIG. 2A. There are three different embodiments and methods for preparing the substrate 100 in accordance with the present invention. In the first method, a bare silicon(Si) plate having a flat top surface is utilized as the substrate 100. In the second method, the substrate 100 is prepared by: preparing a bare silicon(Si) plate having a flat top surface; and then forming a silicon dioxide layer on the top surface of the Si plate by using a thermal oxidation until the silicon dioxide layer has a thickness range from 4000 Å to 6000 Å. In the third method, the substrate 100 is formed by: preparing a base plate being made of a magnetic material, e.g., a Ni—Zn ferrite, and having a flat top surface; and then forming an anti-reaction layer(not shown), made of $Al_2O_3$ or $SiO_2$, on the top surface of the base plate by using a evaporation method until the anti-reaction layer has a thickness above 1000 Å.

Figure 2B:
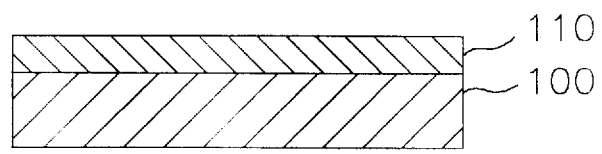

As shown in FIG. 2B, an Sb layer 110 having a uniform thickness of 0.1 to 5.0 $\mu$m is formed on top of the substrate 100 by using an evaporation method. In order to enhance the adhesion between the substrate 100 and the Sb layer 110, the substrate 100 is pre-heated until the temperature of the substrate 100 is maintained at about 100° C. during the deposition of the Sb layer 110. If the substrate 100 is prepared by the third method, the anti-reaction layer prevents the Sb layer 110 from reacting with the base plate of the substrate 100.

Figure 2C:
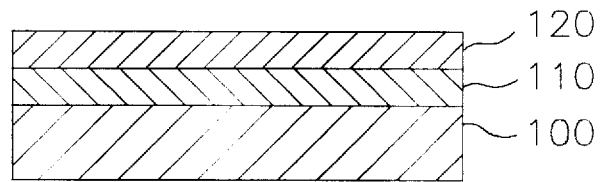

As depicted in FIG. 2C, an In layer 120 is formed on top of the entire surface of the Sb layer 110 using an evaporation method. The thickness of the In layer 120 is within a range from 0.1 to 5.0 µm. During the formation of the Sb layer 110 and the In layer 120, the evaporation method is performed in an E-beam apparatus which is maintained above $5 \times 10^{-5}$ torr.

Figure 2D:
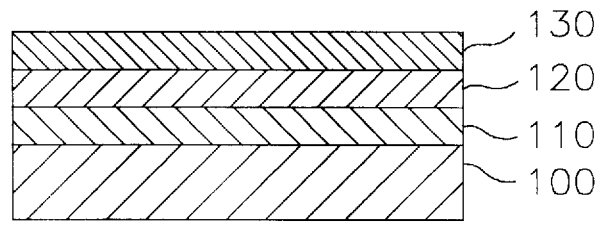

Referring to FIG. 2D, a protection layer 130, made of aluminum oxide($Al_2O_3$) or silicon dioxide($SiO_2$) and having a thickness of 500 to 5000 Å, is deposited on top of the In layer 120 for suppressing a reevaporation of the Sb layer during the following heat treatment process.

Figure 2E:
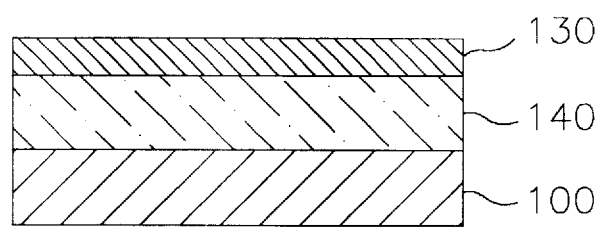
Figure 3:
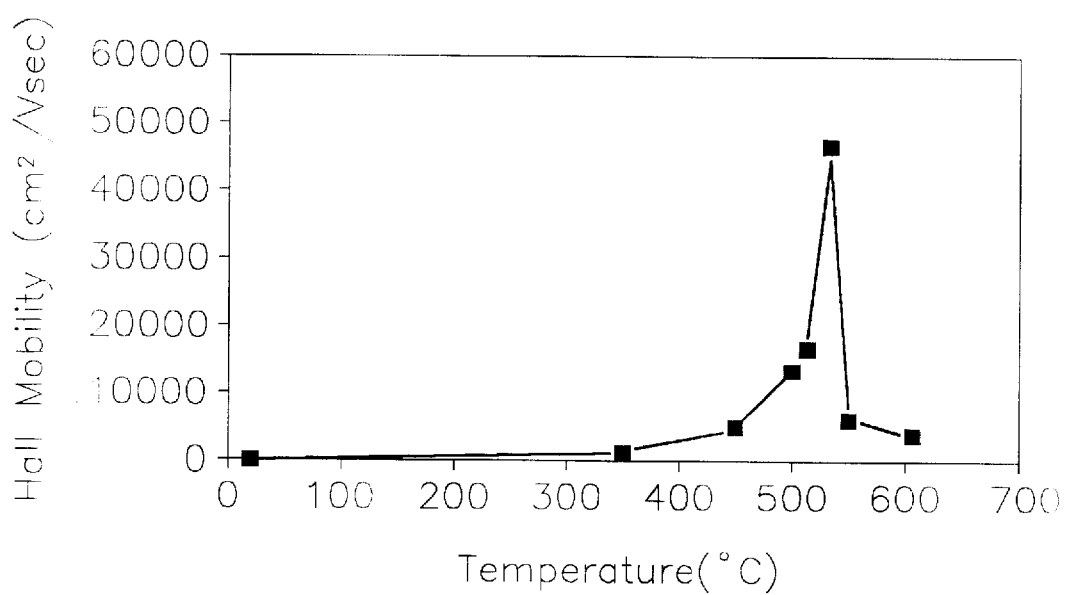
FIG. 3 shows a plot of hall mobility in the InSb thin film layer formed in accordance with the inventive method as a function of an annealing temperature.

Subsequently, the sequentially deposited layers 110, 120 are heat-treated to form a compound phase through the inter-diffusion of Sb layer 110 and In layer 120, as shown in FIG. 2E. The heat-treatment is carried out in air. Specifically, in FIG. 3, there is shown the hall mobility experimental data of the InSb thin film layer formed in accordance with the inventive method which are measured by changing the annealing temperature for 5 minutes. According to the experimental data, it is preferable that the heat treatment of the sequentially deposited layers 110, 120 is performed at the melting point of the compound phase, i.e., 535° C., for five minutes in order to obtain a maximum Hall mobility.

Figure 2F:
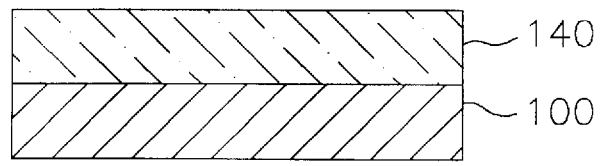

As represented in FIG. 2F, the protection layer 130 formed on top of the InSb layer 140 is removed by using an appropriate solution, e.g., a diluted hydrogen fluoride(HF) solution.

In comparison with the prior art method for forming the InSb layer, the inventive method for forming the InSb layer dispenses with the formation of the adhesion layer, thereby simplifying the overall InSb manufacturing procedure. This is achieved by pre-heating the substrate about 100° C., allowing the Sb layer to be deposited on top of the substrate.

While the present invention has been described with respect to certain preferred embodiments only, other modifications and variations may be made without departing from the spirit and the scope of the present invention as set forth in the following claims.

What is claimed is:

1. A method for forming an indium antimonide layer by a sequential evaporation for use as a magnetic sensing material having high electron mobility, the method comprising the steps of:
   (a) preparing a substrate;
   (b) pre-heating the substrate at about 100 degrees C. for improving the adhesion between the substrate and antimony;
   (c) depositing an antimony layer on top of the substrate;
   (d) forming an indium layer on top of the antimony layer to thereby obtain a sequentially deposited layer, wherein the sequentially deposited layer includes the antimony and the indium layers; and
   (e) heat treating the sequentially deposited layer to force inter-diffusion of antimony and indium, thereby producing the indium antimonide layer.

2. The method of claim 1, wherein the substrate is made of silicon.

3. The method of claim 2, further comprising, before said pre-heating step (b), the step of:
   (a12) forming a silicon dioxide layer on top of the substrate by using a thermal oxidation.

4. The method of claim 3, wherein said forming step (a12) is performed until the silicon dioxide layer has a thickness between 4500 Å to 5500 Å.

5. The method of claim 1, wherein said preparing step (a) includes the steps of:
   (a21) preparing a base being made of a magnetic material; and
   (a22) forming an anti-reaction layer, on top of the base, for preventing the antimony layer from reacting with the base.

6. The method of claim 5, wherein the magnetic material is a Ni—Zn ferrite.

7. The method of claim 6, wherein the anti-reaction layer is a material selected from the group consisting of $Al_2O_3$ and $SiO_2$.

8. The method of claim 1, wherein the antimony layer has a thickness between 0.1 to 5.0 µm.

9. The method of claim 1, wherein the indium layer has a thickness between 0.1 to 5.0 µm.

10. The method of claim 1, further comprising, between said forming step (d) and said heat treating step (e), the step of:
    (c1) providing a protection layer on top of the sequentially deposited layer for suppressing a reevaporation of the antimony layer during said heat treating step (e).

11. The method of claim 10, wherein the protection layer is a material selected from the group consisting of $Al_2O_3$ and $SiO_2$.

12. The method of claim 1, wherein said heat-treating step (e) is carried out until the temperature reaches a melting point of the indium antimonide.

13. The method of claim 12, wherein said heat-treating step (e)is carried out in air.

14. The method of claim 13, wherein said heat-treating step (e) is carried out at the melting point for about five minutes.

15. The method of claim 14, further comprising, between said forming step (d) and said heat treating step (e), the step of:
    (c1) providing a protection layer on top of the sequentially deposited layer for suppressing a reevaporation of the antimony layer during said heat treating step (e).

16. The method of claim 15, wherein the protection layer is a material selected from the group consisting of $Al_2O_3$ and $SiO_2$.

17. The method of claim 16, further comprising, after said providing step (c1), the step of;
    (c2) removing the protection layer by using a diluted hydrogen fluoride(HF) solution.

* * * * *

UNITED STATES PATENT AND TRADEMARK OFFICE
CERTIFICATE OF CORRECTION

PATENT NO. : 5,861,069
DATED : January 19, 1999
INVENTOR(S) : Seung-Ho Lee

It is certified that error appears in the above-identified patent and that said Letters Patent is hereby corrected as shown below:

On the title page,

Item [30] Foreign Application Priority Data

| Aug. 31, 1996 | [KR] | Rep. of Korea | 96-37490 |
| May 2, 1997 | [KR] | Rep. of Korea | 97-17027 |
| May 2, 1997 | [KR] | Rep. of Korea | 97-17028 |

Signed and Sealed this

Fourth Day of May, 1999

Attest:

Attesting Officer

Q. TODD DICKINSON

Acting Commissioner of Patents and Trademarks